US011869738B2

United States Patent
Hechenberger et al.

(10) Patent No.: US 11,869,738 B2
(45) Date of Patent: Jan. 9, 2024

(54) CONDUCTING TRACK FUSE

(71) Applicant: Tridonic GmbH & Co KG, Dornbirn (AT)

(72) Inventors: Claus Hechenberger, Lustenau (AT); Markus Bildstein, Dornbirn (AT); Jakob König, Hohenems (AT)

(73) Assignee: Tridonic GmbH & Co KG, Dornbirn (AT)

( * ) Notice: Subject to any disclaimer, the term of this patent is extended or adjusted under 35 U.S.C. 154(b) by 0 days.

(21) Appl. No.: 17/632,538

(22) PCT Filed: Sep. 8, 2020

(86) PCT No.: PCT/EP2020/075018
§ 371 (c)(1),
(2) Date: Feb. 3, 2022

(87) PCT Pub. No.: WO2021/048090
PCT Pub. Date: Mar. 18, 2021

(65) Prior Publication Data
US 2022/0277915 A1    Sep. 1, 2022

(30) Foreign Application Priority Data

Sep. 13, 2019 (AT) ............... A 501662019

(51) Int. Cl.
*H01H 85/046* (2006.01)
*H01H 85/02* (2006.01)
(Continued)

(52) U.S. Cl.
CPC ...... *H01H 85/046* (2013.01); *H01H 85/0241* (2013.01); *H01H 85/055* (2013.01);
(Continued)

(58) Field of Classification Search
CPC ............. H01H 85/046; H01H 85/0241; H01H 85/055; H01H 85/463; H01H 2085/0275;
(Continued)

(56) References Cited

U.S. PATENT DOCUMENTS 4,689,597 A    8/1987 Galloway et al.
5,179,436 A *  1/1993 Asdollahi ............. H01H 85/43
                                                337/203
(Continued)

FOREIGN PATENT DOCUMENTS

DE    9015208       1/1991
DE    100 05 836    10/2006
(Continued)

OTHER PUBLICATIONS

Kim, Hongwon; Nam, Chang Hyun, "Method of Forming Solder Resist Pattern of Printed Circuit Board", Jun. 10, 2005, Samsung Electro Mech., Entire Document (Translation of KR 20050054042). (Year: 2005).*

(Continued)

*Primary Examiner* — Stephen S Sul
(74) *Attorney, Agent, or Firm* — Andrus Intellectual Property Law, LLP

(57) ABSTRACT

The invention relates to a conducting track fuse (1) for an electrical or electronic device, comprising: a first and a second connection region (2a, 2b); a nonlinearly extending burn-out region (3), which is arranged between the first and second connection regions (2a, 2b); and a covering element (15), which has at least two side walls (9) and a covering face (8), which covering element is arranged over the first and second connection regions (2a, 2b) and over the burn-out region (3), the burn-out region (3) and the covering element (5) being arranged relative to each other in such a way that the area of the covering face (8) covers the burn-out region (3) and a cavity (7) is formed between the burn-out region (3) and the covering face (8) as a result of the height of the side walls (9).

10 Claims, 3 Drawing Sheets

(51) Int. Cl.
*H01H 85/055* (2006.01)
*H05K 1/02* (2006.01)
*H01H 85/46* (2006.01)

(52) U.S. Cl.
CPC ......... *H01H 85/463* (2013.01); *H05K 1/0213* (2013.01); *H05K 1/0272* (2013.01); *H01H 2085/0275* (2013.01); *H05K 2201/10181* (2013.01)

(58) Field of Classification Search
CPC ......... H01H 2085/0414; H01H 85/175; H05K 1/0213; H05K 1/0272; H05K 2201/10181
See application file for complete search history.

(56) References Cited

U.S. PATENT DOCUMENTS

| | | | | |
|---|---|---|---|---|
| 5,923,239 | A * | 7/1999 | Krueger | H05K 1/0293 337/296 |
| 7,436,284 | B2 * | 10/2008 | Bender | H01H 85/0047 337/228 |
| 7,489,229 | B2 * | 2/2009 | Jollenbeck | H01H 85/046 337/231 |
| 2006/0107524 | A1 * | 5/2006 | Engle | H05K 1/141 29/840 |
| 2008/0191832 | A1 * | 8/2008 | Tsai | H01H 85/0411 29/623 |
| 2013/0313008 | A1 * | 11/2013 | Steiner | H01H 85/0039 337/294 |
| 2016/0111240 | A1 | 4/2016 | Beckert et al. | |
| 2016/0255723 | A1 * | 9/2016 | Steiner | H05K 1/16 337/186 |
| 2019/0372337 | A1 * | 12/2019 | Quest-Matt | H02H 9/02 |
| 2020/0227225 | A1 * | 7/2020 | Yokomizo | H01H 85/08 |

FOREIGN PATENT DOCUMENTS

| | | | |
|---|---|---|---|
| DE | 102016219771 | 4/2018 | |
| KR | 20050054042 A * | 6/2005 | ........... H05K 3/1275 |
| WO | 2012084525 | 6/2012 | |

OTHER PUBLICATIONS

PCT/EP2020/075018, International Search Report and Written Opinion dated Nov. 9, 2020, 12 pages.

* cited by examiner

CONDUCTING TRACK FUSE

CROSS REFERENCE TO RELATED APPLICATIONS

The present application is the U.S. national stage application of international application PCT/EP2020/075018 filed Sep. 8, 2020, which international application was published on Mar. 18, 2021 as International Publication WO 2021/048090 A1. The international application claims priority to Austrian Patent Application 501662019 filed Sep. 13, 2019.

FIELD OF THE INVENTION

The invention relates to a conducting track fuse for electrically protecting electrical devices.

BACKGROUND OF THE INVENTION

Conducting track fuses are already known from the prior art. They are placed on a printed circuit board or circuit board and, in the case of an abnormal operating state, such as a short circuit of electrical components of the circuit board, are tasked with quickly and reliably cutting off the electrical connection to the voltage supply. In particular, further damage to the circuit board or to the electrical components located thereon can thereby be avoided. Furthermore, it is possible to prevent tripping of a network circuit breaker by premature tripping of the conducting track fuse.

By providing a conducting track fuse on a circuit board, it is also possible to replace an otherwise standard fine-wire fuse for protecting electrical or electronic devices.

The conducting track fuse generally comprises at least one conducting track section, which is embodied as a safety fuse or fuse element. Said conducting track section has a narrowed cross section in comparison to the other conducting tracks on the circuit board. The fuse element is heated by the current flowing through it and melts or vaporizes when the rated current of the fuse element is significantly exceeded, which leads to an interruption in the current circuit.

In this case, care must be taken to ensure that any arc that can occur can be extinguished in a controlled manner and in particular cannot reach any other conducting tracks. In particular, any plasma arising during the melting or vaporization of the fuse should be prevented from finding a new live contact pair and, as a result, continuing to burn in an uncontrolled manner and thus causing further damage to the circuit board.

DE 100 05 836 B4 describes a printed circuit board for an electrical or electronic device comprising a printed circuit board fuse, wherein the printed circuit board carries a conducting track to be protected and wherein the conducting track comprises a region with a reduced cross section as burn-out region and is provided with a non-conductive coating. In addition, the conducting track comprises at least two accumulations of non-conductive material that are arranged at a distance from one another and spaced apart from one another in the longitudinal direction of the conducting track and are provided in addition to the coating.

SUMMARY OF THE INVENTION

Proceeding from this known prior art, it is an object of the invention to provide a cost-effective conducting track fuse for a printed circuit board or circuit board, which, in the event of a fault, enables a safe and secure disconnection of the power supply to the circuit board and thus improves the operational safety of the circuit board.

This object is achieved according to the invention by the features of claim 1. Particularly advantageous embodiments of the invention are described in the dependent claims.

In a first aspect, the present invention relates to a conducting track fuse on a printed circuit board, comprising a first and second connection region, a nonlinearly extending burn-out region arranged between the first and second connection regions, and an associated a covering element applied to the printed circuit board over the track fuse and its burn out region, The present invention makes it possible to provide a conducting track fuse that is simple to produce but at the same time highly efficient, with the aid of which the operational safety of an electrical or electronic device is increased.

In an advantageous embodiment of the invention, the burn-out region in plan view comprises an at least partially curved or partially zigzag-shaped profile. This curved or zigzag-shaped profile of the burn-out region preferably extends along a main extension direction of the burn-out region. This main extension direction of the burn-out region preferably corresponds to a direct connection of the first and second connection regions of the conducting track fuse in plan view. The curved or zigzag-shaped profile of the burn-out region preferably extends on both sides of the main extension direction of the burn-out region to the same extent.

In a further preferred embodiment, the curved or zigzag-shaped profile can also be designed in such a way that said profile of the burn-out region extends further to one side of the main extension direction of the burn-out region than to an opposite side of the main extension direction.

Furthermore, the burn-out region can also have a different non-linear profile.

The production time and the production costs of the conducting track fuse may be reduced. At the same time, reliable protection of the circuit board with the aid of the conducting track fuse according to the invention is facilitated.

The burn-out region of the conducting track fuse is preferably a non-tin-plated copper conductor, which has a reduced cross section compared to the first and second connection regions. However, the burn-out region can also be formed from another material, such as fine silver. The cross-section of the burn-out region is preferably between 0.05 and 1 mm.

In the event a current that significantly exceeds its rated current is applied to the burn-out region, the burn-out region melts or vaporizes. Furthermore, the covering element of the conducting track fuse ensures that the plasma that is produced thereby does not reach other live contact pairs.

In this way, a conducting track fuse with a defined tripping region is provided, wherein the resulting plasma is kept as small as possible during vaporization of the burn-out region.

In a second aspect, the present invention describes a printed circuit board comprising a conducting track fuse with the features described above.

The present invention accordingly makes it possible to increase the operational safety of the printed circuit board with a conducting track fuse that is easy to produce.

In a further aspect, the present invention describes an operating device for light sources comprising a conducting track fuse according to the invention.

BRIEF DESCRIPTION OF THE DRAWINGS

Advantageous exemplary embodiments of the present invention are shown in the following figures and are explained in more detail with reference to the following description.

DETAILED DESCRIPTION

Figure 2:
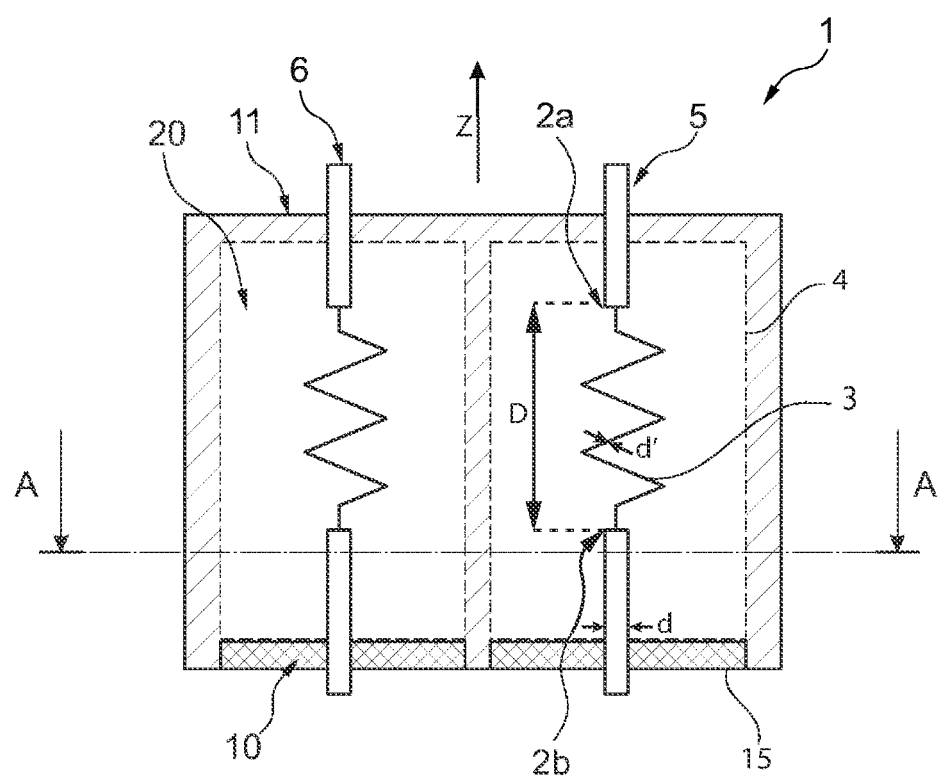
FIG. 2 shows a schematic plan view of the conducting track fuse according to the invention according to a second exemplary embodiment.

FIG. 2 shows a schematic plan view of the conducting track fuse 1 according to the invention according to a first exemplary embodiment. The conducting track fuse 1 is applied to a printed circuit board or circuit board 20 and comprises a first and second connection region 2a, 2b. The connection regions 2a, 2b are arranged at a distance D, which is preferably between 3 and 15 mm.

A burn-out region 3 is arranged between the first and second end regions 2a, 2b and is electrically contacted with said regions. The burn-out region has a cross section d' that is reduced compared to the cross section d of the first and second connection regions 2a, 2b. Advantageously, the cross section d' of the burn-out region 3 is also reduced compared to the other conducting tracks 5, 6 located on the circuit board 20 (see FIG. 3).

The cross section d' of the burn-out region 3 is dimensioned in such a way that the burn-out region vaporizes or melts when the rated current of the conducting track fuse 1 is exceeded.

The burn-out region 3 is preferably arranged non-linearly between the first and second connection regions 2a, 2b. In a preferred embodiment, the burn-out region 3 has a zigzag-shaped profile that extends along a main extension direction Z.

The main extension direction Z preferably corresponds to the direct or shortest connection of the first and second connection regions 2a, 2b.

The zigzag-shaped profile of the burn-out region 3 preferably extends to the same extent on both sides of the main extension direction Z. However, it is also possible for the zigzag-shaped profile to extend to a different extent from the main extension direction Z.

FIG. 2 shows a schematic plan view of the conducting track fuse 1 according to the invention for an electrical or electronic device, comprising a first and second connection region 2a, 2b, a burn-out region 3 arranged between the first and second connection regions 2a, 2b and extending linearly or non-linearly, and a covering element 15 having at least two side walls 9 and a covering face 8. The covering element 15 is arranged over the first and second connection regions 2a, 2b and the burn-out region 3. The burn-out region 3 and the covering element 15 are arranged relative to one another in such a way that the area of the covering face 8 covers the burn-out region 3 and a cavity 7 is formed between the burn-out region 3 and the covering face 8 as a result of the height of the side walls 9.

In plan view, the burn-out region 3 can have a linear profile, a zigzag-shaped profile or an at least partially curved or angular profile.

The side walls 9 are arranged in parallel to a main extension direction of the burn-out region 3.

The burn-out region 3 has a reduced cross section d' compared to the first and second connection regions 2a, 2b.

The covering element 15 with the at least two side walls 9 is preferably homogeneous and has a constant thickness t.

The covering element 5 can be designed in such a way that the side walls 9 do not completely surround the cavity 7, so that a gas vent 10 is formed on an end face of the covering element 15 in plan view of the conducting track fuse.

The covering element 15 can have a delimiting wall 11 that is arranged opposite the gas vent 10 in such a way that it connects the two side walls 9 at one end of the covering element 15.

The burn-out region 3 can be a non-tin-plated copper conductor.

The covering face 8 can also have a surface that is enlarged by wave shape or ribs.

The covering element 15 can also be round or oval, and thus have side walls in a rounded shape.

A web can be arranged in the gas vent 10 of the covering element 15. Such a web can prevent the gas vent 10 from closing during the soldering process when the operating device is being assembled.

Thus, according to the invention, a printed circuit board 20 comprising a conducting track fuse 1 according to the aforementioned features can be formed.

The covering element 15 can be attached with the underside of the side walls 9 to the printed circuit board 20 and is preferably connected by means of a connecting element 4.

The connecting element 4 can be a bar or strip of non-conductive material, preferably SMD adhesive or solder resist.

The connecting element 4 can be applied with the aid of a template.

Vaporizing or melting of the remaining burn-out region 3 with the formation of plasma is avoided by means of the covering element 15, which cools the underlying conducting tracks 3.

On the circuit board 20, the covering element 15 is arranged linearly between the first and second connection regions 2a, 2b and thus follows the main extension direction Z of the burn-out region 3. The covering element 15 is in this case of constant width B.

The covering element 15 is furthermore preferably arranged centrally with respect to the main extension direction Z on the circuit board 20.

Figure 1:
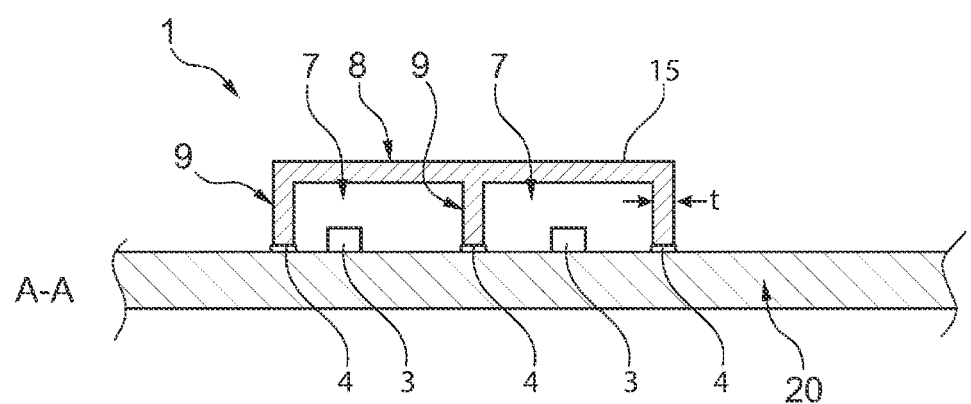
FIG. 1 shows a schematic cross section of the conducting track fuse according to the invention according to a first exemplary embodiment.

FIG. 1 shows a schematic cross section along the section line A-A of the conducting track fuse according to the invention according to a second and third exemplary embodiment. Said exemplary embodiment substantially corresponds to the exemplary embodiment according to FIG. 2 with the section line A-A, wherein the same components are provided with the same reference signs.

According to the exemplary embodiment shown in FIG. 2, the burn-out region 3 has an at least partially an angular or rectangular profile. The at least one tripping region 3a is in turn delimited by the covering element 15 on both sides.

The conducting track fuse according to the invention can thus be produced in a simplified manner. In this case, the connection regions 2a, 2b, which are preferably electrically connected to further conducting tracks of the circuit board 20, are applied together with said conducting tracks to the circuit board 20. In the same method step or in a method step following directly thereafter, the conducting track forming the burn-out region 3 can be applied onto the circuit board 20 between the first and second connection regions 2a, 2b.

"Application" of the conducting tracks onto the printed circuit board 20 is also understood in particular to mean etching of the respective conducting track from a thin copper layer located on the printed circuit board.

In a subsequent method step, the connecting element 4 can be applied to the printed circuit board 20. In this case, the covering region 4 is preferably applied with the aid of a template. In a simultaneous step, a uniform thickness of the connecting element 4 can be achieved by blade coating or dispensing. In a further step, the covering element 15 is applied.

In an alternative variant, the connecting element 4 could also be formed by tin solder and the covering element 15 could be attached, for example, during a reflow soldering process.

It is primarily important for the gas vent 10 to be maintained.

The covering element 15 can thus serve as corrosion or contact protection.

As can be seen in FIG. 2, the connecting element 4 is clearly formed in a film-like manner and is preferably made of a non-conductive material, for example solder resist or SMD adhesive.

The connecting element 4 and/or covering element 15 may also contain arc-extinguishing substances.

If the connecting element 4 is formed by SMD adhesive, the connecting element 4 is preferably applied in one step during the production of the circuit board with the adhesive points to be applied to the circuit board 20.

The selective application of the connecting element 4 can thus take place in one step with the application of the adhesive points onto the circuit board 20.

A simplified production process of the printed circuit board 20 is thus possible.

Figure 3:
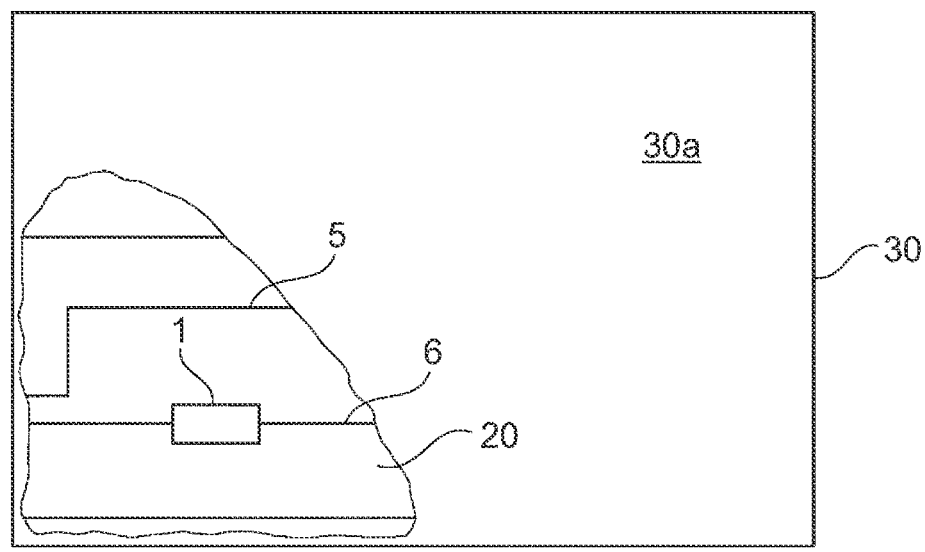
FIG. 3 shows a printed circuit board of an electrical or electronic device comprising a conducting track fuse according to the invention.

FIG. 3 shows a ballast 30 for a light source comprising a circuit board 20 onto which the conducting tracks 5, 6 forming the operating device of the light source are applied. The ballast 30 comprises a conducting track fuse 1 according to the invention.

The circuit board 20 is located in the interior of a housing 30a of the device 30. The conducting tracks 5, 6 are in contact with an external power supply (not shown), for example a 230V mains supply.

The conducting track 6 is electrically contacted with a conducting track fuse 1 according to the invention. This enables electrical protection of the conducting track 6 and thus of the electrical device 30.

A short circuit occurring in the circuit or an abnormal operating state that leads to a current in the conductor paths 5, 6 that significantly exceeds the rated current of the conducting track fuse 1 can thus be reliably interrupted by the conducting track fuse 1.

Preferably, the conducting track fuse is arranged in the operating device in such a way that the gas vent 10 is arranged in the opposite direction to the terminals for contacting the mains connection of the operating device, so that degassing of the conducting track fuse in the direction of the interior of the operating device takes place. Typically, the conducting track fuse is arranged within the housing 30a in the vicinity of the terminals for contacting the mains connection of the operating device. Preferably, the conducting track fuse is arranged in the operating device with the housing 30a in such a way that the gas vent 10 is directed in the direction of the interior of the housing 30a, that is to say in the opposite direction to the terminals for contacting the mains connection of the operating device or other openings on the sides of the housing 30a.

The conducting track fuse is tripped in the event of a fault, i.e., for example, when a current of 160 A DC is fed in at the mains connections of the operating device. This high current results in the conductor material of the conducting track fuse burning explosively and forming a plasma. The energy released spreads out where it meets no resistance or only low resistance.

However, the covering element 15, which is arranged over the burn-out region 3, prevents the energy from spreading out in an uncontrolled manner. The covering element 15 is open in one direction by means of the gas vent 10. The size and position of the gas vent 10 can be determined individually depending on the size and shape of the conducting track fuse. By means of a corresponding orientation of the covering element 15 with the gas vent 10 within the housing 30a, the direction of the energy released by the conducting track fuse can be selected, and the energy can thus be guided into a region of the housing 30a, in which it can be absorbed sufficiently before it enters an outer region of the housing 30a.

Figure 4:
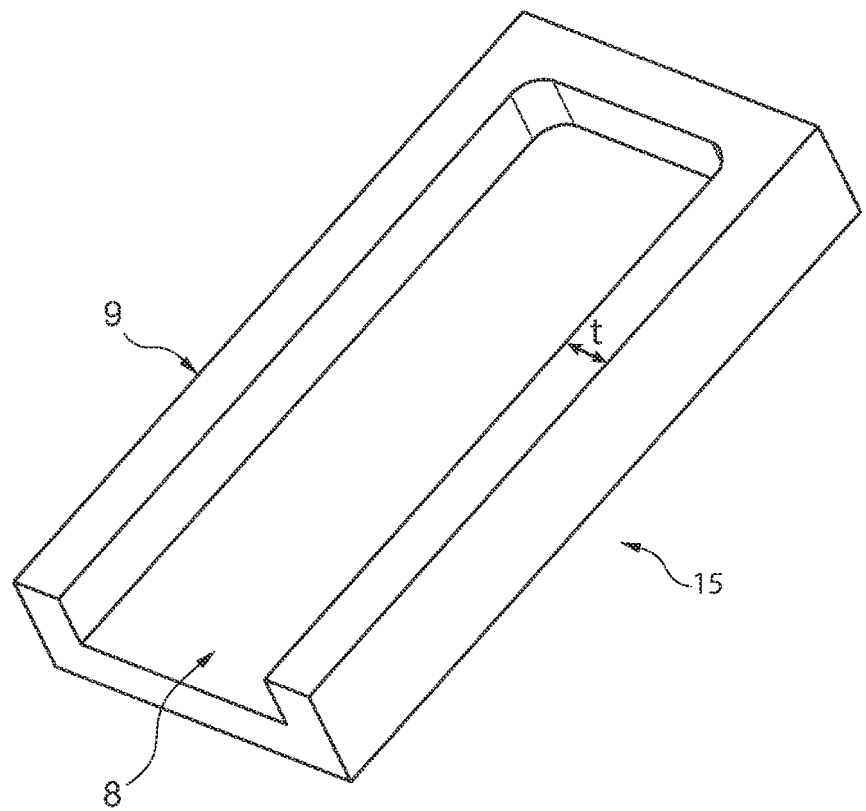
FIG. 4 shows an embodiment of a covering element according to the invention.

FIG. 4 shows an exemplary embodiment of a covering element 15. For example, the covering element 15 can be provided only for a single burn-out region 3 and thus a single conducting track 6, wherein a plurality of individual covering elements 15 may be provided for a plurality of individual burn-out regions 3.

What is claimed is:

1. An operating device for light sources comprising a printed circuit board (20) with a conducting track (6) providing electrical connection from a terminal of an external power supply; a conducting track fuse (1) applied to the printed circuit board and connected to the conducting track (6), said conducting track fuse (1) comprising a first connection region (2a) connected to a portion of the conducting track (6) in contact with the terminal of the external power supply and a second connection region (2b), a burn-out region (3) arranged between the first connection region (2a) and the second connection region (2b); and a covering element (15) having two side walls (9), a delimiting wall (11) and a covering face (8), which is arranged over the first and second connection regions (2a, 2b) and over the burn-out region (3), wherein the burn-out region (3) and the covering element (15) are arranged relative to one another in such a way that the covering face (8) covers the burn-out region (3) and the delimiting wall (11) crosses the portion of the conducting track (6) connecting the first connection region (2a) of the conducting track fuse (1) and the terminal of the external power supply, and a cavity (7) is formed between the burn-out region (3) and the covering face (8) as a result of a height of the two side walls (9);

wherein each of the two side walls of the covering element (15) has an underside that is attached to the printed circuit board (20) and is attached by means of a connecting element (4), and further wherein said covering element (15) includes a gas vent (10) arranged opposite the delimiting wall (11) and between the two side walls, and wherein the second connection region (2b) extends through the gas vent (10).

2. The operating device according to claim 1, characterized in that the burn-out region (3) of the conducting track fuse has a zigzag-shaped profile in plan view.

3. The operating device according to claim 1, characterized in that the two side walls (9) of the covering element (15) are arranged in parallel to a main extension direction of the burn-out region (3).

4. The operating device according to claim 1, characterized in that the burn-out region (3) of the conducting track fuse has a reduced cross section (d') compared to the first and second connection regions (2*a*, 2*b*).

5. The operating device according to claim 1, characterized in that the covering element (15) has a constant wall thickness (t).

6. The operating device according to claim 1, characterized in that the burn-out region (3) of the conducting track fuse is a non-tin-plated copper conductor.

7. The operating device according to claim 1 wherein the connecting element (4) is a bar or strip of non-conductive material consisting of SMD adhesive or solder resist.

8. The operating device according to claim 1 wherein the connecting element (4) is applied to the printed circuit board with the aid of a template.

9. The operating device according to claim 1 wherein the covering element includes a supporting web across the gas vent.

10. The operating device according to claim 1 wherein the gas vent of the covering element is open in a direction opposite the terminal of the external power supply.

* * * * *